US006300167B1

United States Patent
Raleigh et al.

(10) Patent No.: US 6,300,167 B1
(45) Date of Patent: Oct. 9, 2001

(54) SEMICONDUCTOR DEVICE WITH FLAME SPRAYED HEAT SPREADING LAYER AND METHOD

(75) Inventors: Carl Raleigh, Phoenix; William C. Roman, Tempe, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/354,384

(22) Filed: Dec. 12, 1994

(51) Int. Cl.$^7$ ........................................ H01L 21/44
(52) U.S. Cl. .................. 438/122; 438/121; 438/758; 438/778; 438/785
(58) Field of Search ........................ 437/209, 245, 437/246, 211, 214, 215, 217, 219, 220, 974; 427/455; 148/DIG. 135

(56) References Cited

U.S. PATENT DOCUMENTS

| 4,542,401 | 9/1985 | Sekiba . |
| 4,757,934 | 7/1988 | Greenstein . |
| 4,983,427 | * 1/1991 | Sansome et al. ................ 427/455 |
| 5,032,469 | * 7/1991 | Merz et al. ..................... 427/455 |
| 5,342,793 | * 8/1994 | Santangelo et al. ............. 437/245 |
| 5,372,954 | * 12/1994 | Terashima .................. 148/DIG. 135 |

* cited by examiner

Primary Examiner—Kevin M. Picardat

(57) ABSTRACT

A semiconductor device having a heat spreading layer (18,118) of material deposited by flame spraying on a back surface of the semiconductor die (12,112). The semiconductor die (12,112) has a thermal coefficient of expansion substantially similar to the thermal coefficient of expansion of the flame sprayed material. The flame sprayed material may be deposited directly on the semiconductor die (12,112) or on a backmetal layer (15). The heat spreading layer (18,118) is suitable for affixing the semiconductor die (12, 112) to a metal substrate (27,127).

13 Claims, 1 Drawing Sheet

SEMICONDUCTOR DEVICE WITH FLAME SPRAYED HEAT SPREADING LAYER AND METHOD

BACKGROUND OF THE INVENTION

The present invention relates, in general, to semiconductor devices, and more particularly to semiconductor devices having heat spreading layers.

Generally, electronic circuits on semiconductor die generate heat during operation. This is especially true with power semiconductor devices. To alleviate this problem it is common practice to affix the semiconductor die to a heat sink. Conventionally, a semiconductor die is affixed to a heat conductive metal acting as a heat sink which dissipates the heat. One predominant problem that occurs with the conventional method is that the semiconductor die cannot be connected directly to the heat conductive metal. Typically, the semiconductor die has a much different thermal coefficient of expansion (TCE) than the heat conductive metal. Thus, if the semiconductor die is connected directly to the heat conductive metal, the die would be physically damaged by the stresses resulting from differing expansions during temperature cycling.

Semiconductor die, and especially power die, are conventionally bonded to a metal substrate of aluminum by interposing a dielectric layer and possibly other layers of various materials between the aluminum substrate and the die. The other layers typically are selected to permit the die to be soldered to the layered stack of materials so as to maximize heat transfer between the die and the substrate without introducing materials that are incompatible with the TCE of the die. The other layers are deposited on the aluminum substrate in a desired pattern. The die is then soldered to the layered stack using a solder preform.

In a typical prior art structure where the metal substrate is aluminum and the dielectric consists of a layer of alumina ($Al_2O_3$) on the substrate, a metal layer of nickel or copper is interposed between the silicon die and the alumina to provide a surface to which the die is readily soldered. However, the TCE's of nickel and copper are so different from that of silicon that the thermal stresses are unacceptable in most applications. Other metals, such as molybdenum and tungsten have an acceptable TCE's and exhibit good thermal and electrical conductivity, however, a solderable layer is necessary for good adhesion between molybdenum or tungsten and silicon.

Currently, a backmetal layer is deposited on the back surface of the silicon die and a piece part of molybdenum is soldered to the backmetal layer. To reduce the number of piece parts in stock, typically a single size piece part of molybdenum is used for all sizes of silicon die. In order to accommodate all sizes of die, a common piece part of molybdenum must be large enough to receive the largest size die. This results in too large a piece part for small die, which reduces packaging efficiency because an unnecessarily large package footprint is required to support the large molybdenum piece part. Also, this creates a waste of materials. In addition, soldering the silicon die to the piece part of molybdenum produces excessive heat that can damage and/ or change the characteristics of electronic circuits on the die. Furthermore, the solder adds thermal resistance and inhibits heat dissipation due to poor thermal conductivity and the presence of voids between the silicon die and the piece part molybdenum.

What is needed is a heat spreading layer for attaching a semiconductor die to a metal substrate that provides enhanced heat conduction, that requires fewer processing steps than conventional processes, that has TCE compatibility with the semiconductor die, and that does not require solder to attach it to the semiconductor die.

DESCRIPTION OF THE PREFERRED EMBODIMENTS

Figure 1:
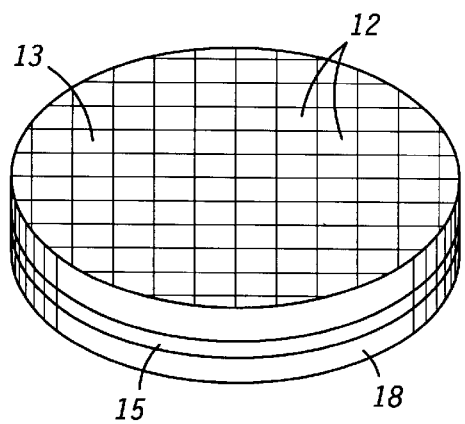
FIG. 1 is a perspective view of a semiconductor wafer having a flame sprayed heat spreading layer affixed to a back surface thereof in accordance with the present invention.

Turning now to the drawings in which like reference characters indicate corresponding elements throughout the several views, attention is first directed to FIG. 1, which illustrates a semiconductor wafer generally designated 10. Semiconductor wafer 10 may be formed from any semiconductor material, such as silicon, germanium, silicon-carbide, silicon-germanium, gallium arsenide, etc. A plurality of semiconductor die 12 are defined on a top surface 13 of semiconductor wafer 10. Each semiconductor die 12 includes an electronic circuit, which in this embodiment is a power circuit dissipating at least one watt during operation. While a power circuit is shown in this embodiment, one skilled in the art will understand that substantially any semiconductor circuit can be incorporated, and that the circuits are formed by any known methods including epitaxial growth, implantation, insulating film deposition, pattern definition, etc.

A backmetal or metal layer 15 is deposited on the back surface of semiconductor wafer 10, opposite top surface 13 which carries the electronic circuits. Backmetal layer 15 is deposited in any conventional manner such as evaporation, sputtering, or the like. Backmetal layer 15 may be formed from any convenient material such as chromium-nickel-gold, titanium-nickel-silver, or any other material that will perform the functions to be described. Backmetal layer 15 is provided to improve adhesion of additional layers and/or to provide ohmic contact to semiconductor wafer 10. It should be understood that in some applications, backmetal layer 15 will not be necessary and the additional layers can be formed directly on semiconductor wafer 10. Throughout this disclosure, when a step of depositing material on a back surface of semiconductor wafer 10 is described, it should be understood that semiconductor wafer 10 may or may not include backmetal layer 15.

Still referring to FIG. 1, a heat spreading layer 18 is flame sprayed onto the back surface of semiconductor wafer 10. Flame spraying a material is normally performed by commercially available equipment, and generally consists of an oxygen/propylene flame, or an oxygen/acetylene flame, into which the material to be deposited is injected. Equipment for flame spraying is available from companies such as Thermal Spray Technology Inc. located in New York. Generally, heat spreading layer 18 comprises any material having a TCE that is substantially similar (within a few points or parts per million) to the TCE of semiconductor wafer 10, for example, molybdenum, tungsten, etc. Flame spraying can be performed relatively uniformly, and heat spreading layer 18 is deposited thick enough to provide uniform heat spreading of any heat generated within each semiconductor die 12. Generally, heat spreading layer 18 is in the range of approximately 0.13 millimeters (mm) to 0.50 mm (approximately 5 to 20 mils) and preferably 0.20 mm to 0.25 mm (8 to 10 mils). Molybdenum and tungsten flame spray sources are readily available on the market.

In conventional devices, a heat spreading piece part is affixed to a die with solder. This is accomplished by sandwiching a preform of solder between a semiconductor die and the heat spreading piece part. The sandwich is then annealed at a temperature in the range of 380°–425° C. for extended periods of time with the temperature exceeding 300° C. for at least 10 minutes. This excessive heat will damage or alter many types of semiconductor die, especially those utilizing diffusion, irradiation and/or implants, which are adversely effected by heat/time. Also 5%–30% voiding between the semiconductor die and the heat spreading piece part occurs. Further it should be noted that these conventional methods only operate to connect semiconductor die to heat spreading piece parts, which requires additional fixtures and handling.

In a method of the present invention flame spraying is used to deposit heat spreading layer 18 over the entire back surface of semiconductor wafer 10, and all of the plurality of semiconductor die 12, in a single step prior to dicing. It should be understood that semiconductor die 12 can be flame sprayed individually to deposit heat spreading layer 18 if desired. In either case, flame spraying a sufficiently thick heat spreading layer 18 can be performed in less than approximately a minute and, consequently, heats semiconductor wafer 10 to less than approximately 200° C. Once heat spreading layer 18 has been deposited on semiconductor wafer 10, semiconductor wafer 10 can be diced into the plurality of semiconductor die 12.

Figure 2:
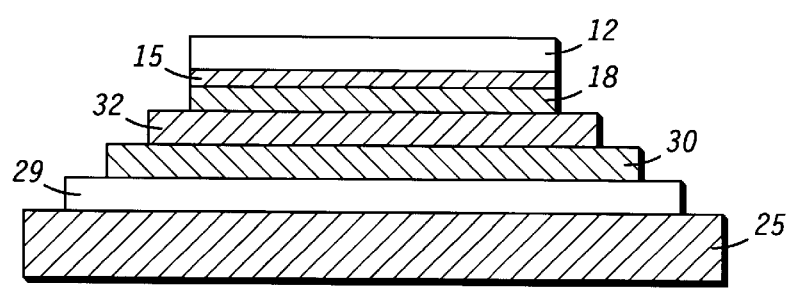
FIG. 2 is a sectional view illustrating a flame sprayed heat spreading layer as it would appear on an electronic device incorporating the present invention.

Turning now to FIG. 2, an electronic device generally designated 20 is illustrated. Electronic device 20 includes an individual semiconductor die 12 (as diced from semiconductor wafer 10) having backmetal layer 15 and heat spreading layer 18 formed thereon as described above, and an insulated metal substrate 25. It should be understood that while an insulated metal substrate is described herein, other types of heat sinks may be utilized in different applications. Insulated metal substrate 25 may be any conventional substrate known in the art, and in this specific embodiment includes a metal substrate 27 such as aluminum on which is deposited a layer 29 of organic insulating material. A copper layer 30 is deposited on layer 29 to permit soldering of heat spreading layer 18 thereto. A preform of solder 32, having a relatively low melting point is melted between heat spreading layer 18 and copper layer 30 to complete electronic device 20. Preferably, a low melting point solder having a melting point in an range from approximately 180–221° C. is used. Optionally, higher temperature solders with melting points up to 320° C. are used when the semiconductor die is not sensitive to elevated soldering temperatures.

Figure 3:
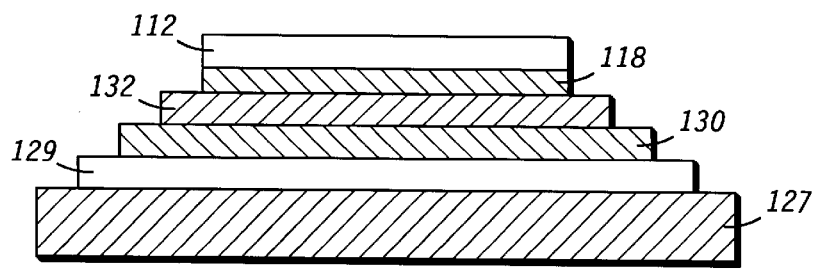
FIG. 3 is a sectional view illustrating another embodiment of a flame sprayed heat spreading layer as it would appear on an electronic device incorporating the present invention.

Directing attention to FIG. 3, another embodiment of an electronic device 120 is illustrated. Electronic device 120 is substantially similar to electronic device 20 of FIG. 2, including a semiconductor die 112, a heat spreading layer 118, a preform of solder 132, a copper layer 130, a layer 129 of an organic insulating material, and a metal substrate 127. Electronic device 120 differs from electronic device 20 in that heat spreading layer 118 is flame sprayed directly to the back surface of semiconductor die 112 with no intervening backmetal layer.

Thus, a new and improved heat spreading layer and method of formation is disclosed. The solder interface between the heat spreading layer and the semiconductor die is eliminated and, therefore, the solder material and voiding that affects localized thermal gradients is eliminated. The elimination of the soldering step reduces heating of the semiconductor die during fabrication which causes additional diffusion and negatively impacts device characteristics. Also, with increased awareness of environmental responsibility, eliminating a solder layer reduces the lead content in the device.

Because the heat spreading layer can be formed directly on the back of a semiconductor wafer prior to dicing, heat spreader piece parts, preforms of solder, and additional processing steps can be eliminated. This reduces handling of the parts and reducing costs. Furthermore, forming the heat spreading layer directly onto the semiconductor wafer prior to dicing always matches the size of the heat spreading layer to the semiconductor die in the finished product reducing the footprint and thereby reducing waste. Reducing the steps in the process and the piece parts employed substantially reduces the cost of fabricating the final device.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method for fabricating a semiconductor device with a flame sprayed heat spreading layer comprising the steps of:

providing a semiconductor die having a thermal coefficient of expansion and a back surface;

providing a material having a thermal coefficient of expansion similar to the thermal coefficient of expansion of the semiconductor die; and flame spraying a heat spreading layer of the material on the back surface of the semiconductor die.

2. The method of claim 1 wherein the step of providing the material includes providing a material selected from a group consisting of molybdenum and tungsten.

3. The method of claim 1 wherein the step of flame spraying includes depositing the heat spreading layer of material in a range of 0.13–0.50 mm thick.

4. The method of claim 1 wherein the step of providing the semiconductor die includes depositing a metal layer on the back surface of the semiconductor die prior to flame spraying the heat spreading layer.

5. The method of claim 1 wherein the step of providing the semiconductor die includes providing a semiconductor wafer including a plurality of semiconductor die defined thereon.

6. The method of claim 5 wherein the step of flame spraying the heat spreading layer of the material further includes flame spraying the heat spreading layer of material on a back surface of the semiconductor wafer so as to cover a back surface of each of the plurality of semiconductor die.

7. The method of claim 6 wherein the step of providing the semiconductor die further includes dicing the semiconductor wafer into individual semiconductor die subsequent to flame spraying the back surface of the semiconductor wafer.

8. A method of fabricating an electronic device comprising the steps of:

providing a semiconductor wafer having a thermal coefficient of expansion, a front surface and a back surface;

defining a plurality of semiconductor die and forming a plurality of electronic circuits, one each on each of the plurality of semiconductor die, on the front surface of the semiconductor wafer;

providing a material having a thermal coefficient of expansion similar to the thermal coefficient of expansion of the semiconductor wafer;

flame spraying a heat spreading layer of the material on the back surface of the semiconductor wafer; and dicing the semiconductor wafer into individual defined semiconductor die.

9. The method of claim 8 further comprising the step of affixing the heat spreading layer of each individual die to a metal substrate.

10. The method of claim 9 wherein the step of affixing the heat spreading layer to an insulated metal substrate includes the step of soldering the heat spreading layer to the metal substrate.

11. The method of claim 8 wherein the step of providing the material includes providing a material selected from a group consisting of molybdenum and tungsten.

12. The method of claim 8 wherein the step of flame spraying includes depositing the heat spreading layer of material in a range of 0.13–0.50 mm thick.

13. The method of claim 8 further including depositing a backmetal layer on the back surface of the semiconductor wafer prior to the step of flame spraying the heat spreading layer.

* * * * *

UNITED STATES PATENT AND TRADEMARK OFFICE
CERTIFICATE OF CORRECTION

PATENT NO.    : 6,300,167 B1
DATED         : October 9, 2001
INVENTOR(S)   : Carl Raleigh and William C. Roman It is certified that error appears in the above-identified patent and that said Letters Patent is hereby corrected as shown below:

<u>Title page,</u>
Item [75], Assignee: -- Semiconductor Components Industries, L.L.C., Phoenix, AZ (US) --

Signed and Sealed this

Twenty-third Day of April, 2002

Attest:

JAMES E. ROGAN
*Attesting Officer*   *Director of the United States Patent and Trademark Office*